United States Patent [19]

Fitzpatrick et al.

[11] Patent Number: 4,465,546
[45] Date of Patent: Aug. 14, 1984

[54] METHOD OF GROWING POLYCRYSTALLINE AND MONOCRYSTALLINE BODIES OF VOLATILE 2,6 AND 3,5 COMPOUNDS IN GRAPHITE CRUCIBLES BY SELF-SEALING AND SELF-RELEASING TECHNIQUES

[75] Inventors: Brian J. Fitzpatrick; Thomas F. McGee, III, both of Ossining, N.Y.

[73] Assignee: North American Philips Corporation, New York, N.Y.

[21] Appl. No.: 413,929

[22] Filed: Sep. 1, 1982

[51] Int. Cl.$^3$ .............................................. C30B 15/10
[52] U.S. Cl. ........................ 156/616 A; 156/DIG. 70; 156/DIG. 72; 156/DIG. 81; 156/DIG. 83; 156/DIG. 92; 432/264; 422/248; 423/509
[58] Field of Search ............... 156/603, 616 R, 616 A, 156/DIG. 70, DIG. 72, DIG. 77, DIG. 81, DIG. 83, DIG. 92, DIG. 93; 23/300; 422/248; 432/264, 265; 164/122.2; 423/509

[56] References Cited

U.S. PATENT DOCUMENTS

| | | | |
|---|---|---|---|
| 3,033,659 | 5/1962 | Fischer | 422/248 |
| 3,243,267 | 3/1966 | Piper | 156/DIG. 72 |
| 3,382,047 | 5/1968 | Holtzberg et al. | 156/603 |
| 3,777,009 | 12/1973 | Menashi et al. | 156/616 A |
| 3,849,205 | 11/1974 | Brau et al. | 156/616 R |
| 3,870,473 | 3/1975 | Kyle | 156/616 A |
| 3,960,501 | 6/1976 | Butuzov et al. | 422/248 |
| 4,251,206 | 2/1981 | Berkman et al. | 422/248 |
| 4,344,476 | 8/1982 | Sutcliffe et al. | 164/122.2 |

OTHER PUBLICATIONS

Albrecht G. Fisher, Preparation and Properties of ZNS-Type Crystals From the Melt, Journal of the Electrochemical Society, vol. 106, No. 9, Sep. 1959, pp. 838 and 839.

Primary Examiner—David L. Lacey
Attorney, Agent, or Firm—Norman N. Spain

[57] ABSTRACT

A large polycrystalline body of a 2,6 or 3,5 volatile compound is produced in a graphite crucible under low external pressure by passing a narrow molten zone through a charge of the compound contained in the graphite crucible the interior of which is coated with pyrolytic graphite. By a similar technique, but by use of a hot zone cooler then the molten zone, the polycrystalline body is converted to a monocrystalline body.

14 Claims, 1 Drawing Figure

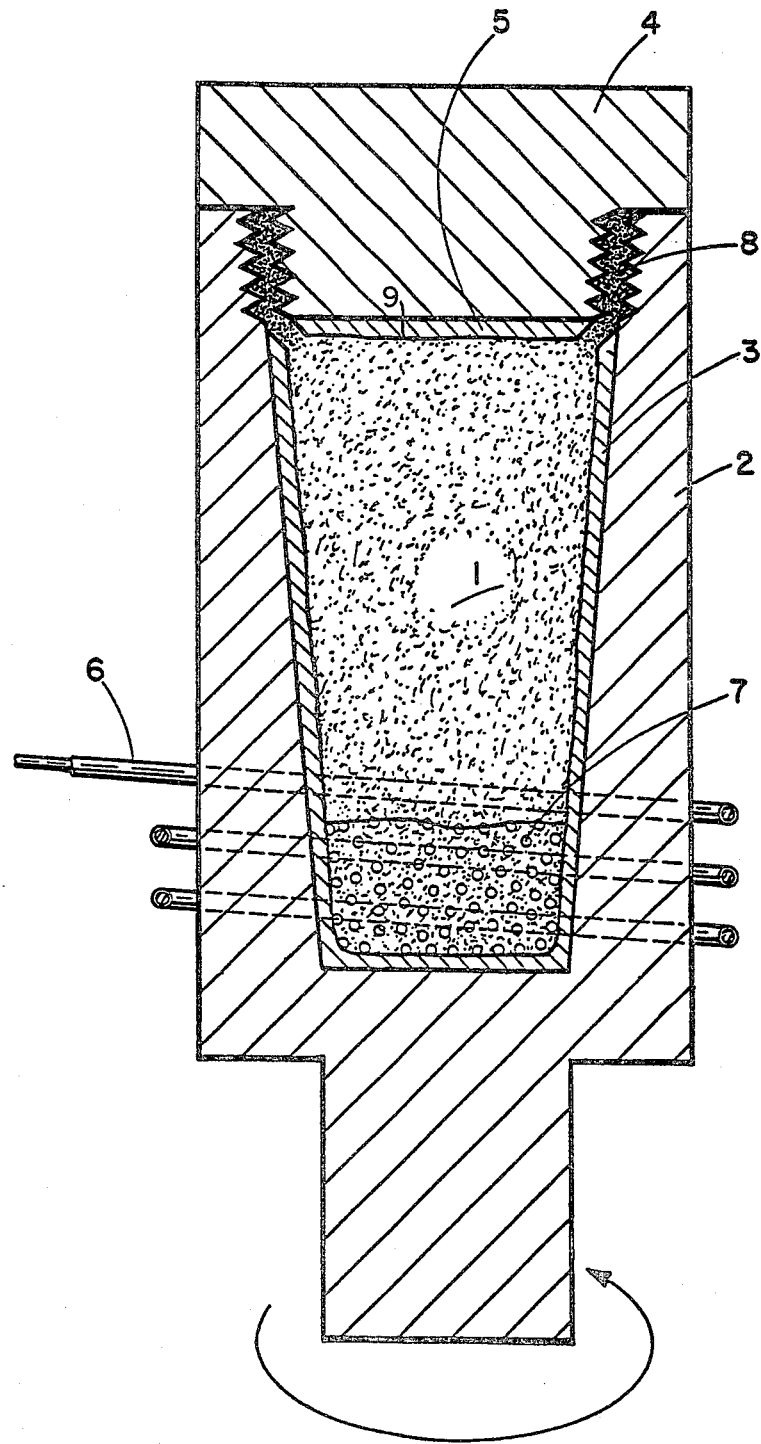

METHOD OF GROWING POLYCRYSTALLINE AND MONOCRYSTALLINE BODIES OF VOLATILE 2,6 AND 3,5 COMPOUNDS IN GRAPHITE CRUCIBLES BY SELF-SEALING AND SELF-RELEASING TECHNIQUES

BACKGROUND OF THE INVENTION

The invention in this case relates in one aspect to a novel method of growing large polycrystalline bodies of volatile 2,6 and 3,5 compounds.

Another aspect of the invention relates to a novel method for the production of large monocrystal bodies of volatile 2, 6 and 3, 5 compounds.

According to the methods that have been previously employed, the growth of single crystals of 2,6 and 3,5 compounds from the melt has frequently been carried out by use of a quartz crucible. Such a procedure is described in Brau et al U.S. Pat. No. 3,849,205 and in Holton et al J. Crystal Growth 6 (1969) 97–100. A major disadvantage in the use of these methods lies in the use of the quartz ampul. The problems that result from the use of a quartz ampul is that the ampul can only be used for a single time and frequently contamination occurs from the quartz. Further it has been found difficult to obtain large size crystals of 2,6 and 3,5 compounds when quartz ampules are employed.

In order to avoid the use of quartz ampules the use of graphite crucibles in crystal growing techniques has been suggested.

Such use of graphite crucibles for the growth of a 2,6 and 3,5 compound crystals has been described in K. K. Dubenskiy et al Sov. J. Optical Technology 36(2): 118–121 Jan. 1969, by Kikuma et al J. Crystal Growth 41 (1977) 103–108; and in Kikuma et al, J. Crystal Growth 44 (1978) 467–472.

In these methods monocrystals of 2,6 compounds such as zinc selenide are formed from the melt frequently by use of the Bridgman technique. However, due to the large internal pressures developed during the process and the porous nature of graphite, the use of the graphite crucible necessitates the use of high external pressures ranging from about 20 to 1,000 or more atmospheres. As a result the use of expensive equipment is required and it is very difficult to produce large size crystals. In addition due to the use of the high pressures undesirable inclusions such as gas bubbles occur in the resultant crystals, and the energy consumption is very high.

GENERAL DESCRIPTION OF THE INVENTION

An object of this invention is to provide a new and improved method for the production of large polycrystalline bodies of 2,6 and 3,5 compounds.

Another object of this invention is to provide a new and improved method of providing large monocrystalline bodies of volatile 2,6 and 3,5 compounds.

A further object of this invention is to provide a novel method of producing large crystalline bodies of volatile 2,6 and 3,5 compounds in graphite crucibles without the use of large external pressures.

These and other objects of the invention will be apparent from the description that follows.

According to the invention the applicants have developed a new and novel method for producing large crystalline bodies of volatile 2,6 and 3,5 compounds employing a pyrolytic graphite coated graphite crucible while utilizing only low external pressures.

More particularly, according to one aspect of the invention large polycrystalline bodies of volatile 2,6 and 3,5 compounds may be manufactured according to the following procedure:

A graphite crucible, the interior of which is coated with pyrolytic graphite, is filled with a charge of a volatile 2,6 or 3,5 compound which preferably is in a granular powder or in otherwise finely divided form. The crucible is closed with a removable graphite closure which on the surface opposing to the charge is similarly coated with pyrolytic graphite.

A narrow heating zone of a temperature very slightly above the melting point of the volatile compound is applied to the end of the filled crucible remote from the removable closure. As a result a narrow molten zone of the volatile compound is formed at the end of the crucible remote from the removable closure. A small amount of material from this narrow molten zone evaporates and condenses on the adjoining surfaces of the crucible and the closure thereby forming a temporary seal between the closure and the crucible.

The narrow molten zone is progressively moved through the charge in the direction of the seal by applying the narrow heating zone to the interface of the molten zone and the charge of the volatile compound while at the same time progressively freezing the opposite interface of the molten zone.

As a result, a polycrystalline body formed from the charge of the volatile compound is caused to grow in the direction of the seal until substantially all of the charge in the crucible is transformed into a dense polycrystalline body.

The narrow heating zone is progressively moved with reference to the crucible until it reaches the vicinity of the seal wherein the seal is evaporated from the adjacent surfaces of the crucible and the closure. The closure is then removed from the crucible and the resultant polycrystalline body is removed from the crucible.

The use of a narrow heating zone, the coating of the crucible and closure with the pyrolytic graphite together with the formation of the temporary seal between the crucible and the closure avoids the need for the use of large external pressures of 20–100 atmospheres and even up to 1000 atmospheres or more as has been employed in the past. Thus the process of the invention may be carried out at atmospheric pressure.

However, because of loss of material at room pressure the use of higher external atmospheres of up to 20 atmospheres is preferred. The process is preferably carried out in an inert atmosphere such as nitrogen or argon.

The coating of the crucible and closure with the pyrolytic graphite acts not only to prevent diffusion of the material from the charge through the graphite thus reducing the need for the use of high external pressures but also serves to prevent sticking of the resultant polycrystalline body to the surface of the crucible thus simplifying the removal of the polycrystalline body from the crucible.

While the charge of volatile compound may be in any solid form, such as powder, in small chunks or even in a single piece, it is preferable that the charge be in a powder form in order to provide the largest concentration of material in the crucible.

While any method of thus producing the narrow heated zone may be employed it is most convenient to employ an RF coil.

A preferred type of crucible has a threaded opening into which a closure with matching threads may be screwed. With this form of construction an excellent seal is formed by condensation of the material from the volatile charge between the corresponding threads and when the seal is broken (by applying heat to it with the RF coil, thus evaporating it) the closure is readily separated from the crucible.

Further, by employing a crucible the interior of which is tapered so that the cross sectional area is at its maximum near the opening, the polycrystalline body is readily slipped out of the crucible.

Inspection of the polycrystalline bodies produced by the method of the invention shows that, unlike those produced in quartz ampules, they are significantly free of contamination.

While the instant method is applicable to all volatile 2,6 and 3,5 compounds it has been found that this method is most usefully employed with the following compounds: ZnS, ZnSe, $ZnS_{0.1}Se_{0.9}$, ZnTe, CdS, CdSe, $CdS_{0.5}Se_{0.5}$, $Cd_{0.2}Hg_{0.8}Te$, InP, GaAs and $In_{0.7}Ga_{0.3}As_{0.6}P_{0.4}$.

Preferably the molten zone is moved through the charge at the rate of 5-50 mm/hr.

For the ZnSe a rate of about 22 mm/hr is preferred while employing a heating zone temperature very slightly above 1520° C.

According to a second aspect of the invention large monocrystalline bodies of volatile 2,6 or 3,5 compounds may be formed from large polycrystalline bodies of those compounds by subjecting these polycrystalline bodies to a procedure that is a modification of the above-described procedure of the invention for the formation of the polycrystalline bodies.

For producing the monocrystalline body the procedures of the invention for producing the polycrystalline body are modified firstly in that instead of forming a narrow molten zone, a narrow hot zone of a temperature of about 5° C.-100° C. below the melting point of the compound is formed in the polycrystalline body. Further, the rate of movement of the hot zone through the polycrystalline body is generally considerably less than the rate of the movement of the molten zone through the charge of the volatile compound employed for forming the polycrystalline body.

When the polycrystalline body is subjected to this procedure, and a narrow hot zone is formed in the end of the polycrystalline body remote from the closure, a sufficient amount of material from the hot zone evaporates and condenses on the adjoining surfaces of the crucible and closure to form a temporary seal between the closure and the crucible.

The monocrystalline body is formed from the polycrystalline body by progressively moving the hot zone through the polycrystalline body in the direction of the seal. As a result a monocrystalline body is caused to grow in the direction of the seal until substantially all of the polycrystalline body is transformed into a monocrystalline body.

Similarly to the method employed for forming a polycrystalline body the seal is broken by evaporation and the resultant monocrystalline body is removed.

Preferably the rate of movement of the hot zone through the polycrystalline body is about 0.5-10 mm/hr. In the case where the volatile compound is ZnSe it has been found that a narrow hot zone of about 1420° C. with a movement rate of the hot zone through the polycrystalline body of about 1.5 mm/hr. is quite useful.

Similar conditions in regard to the external atmosphere that are applicable to the production of the polycrystalline bodies are also applicable to the production of the monocrystalline body.

Similar advantages are achieved in the production of the monocrystalline body by this method as are achieved in the production of the polycrystalline body.

BRIEF DESCRIPTION OF THE DRAWING

The sole FIGURE in the drawing is a cross-sectional view of a crucible fitted with a closure and containing a charge of a volatile compound suitable for production of a polycrystalline body according to a method of the invention.

DETAILED DESCRIPTION OF THE INVENTION

The invention will now be described in greater detail with reference to the drawing and the following example:

EXAMPLE

Referring to the sole FIGURE in the drawing a charge of 47.85 g of finely divided ZnSe powder 1 is loaded into a graphite crucible internally threaded in the vicinity of the opening 9 and internally coated with pyrolytic graphite 3, the crucible 2 having a tapered interior chamber with the wider cross-section toward the opening 9.

The filled graphite crucible 2 is closed with a threaded graphite sealing plug 4 which is also coated with a pyrolytic graphite coating 5.

The loaded crucible 2 is placed inside a 3-turn RF induction coil 6 in a controlled atmosphere furnace chamber (not shown). The chamber is evacuated to remove the air and filled with nitrogen to a pressure of 90 P.S.I.G.

The crucible 2 is positioned so that the RF coil 6 is located just below the ZnSe powder 1 in the crucible 2.

The power is gradually raised to a point where it is known that ZnSe melts (1520° C.). This setting is found to be 1300 kw. A heating zone length of 1.5 centimeters is thus produced.

The crucible 2 is lowered through the coil 6 at a rate of 22 mm/h. The crucible 2 is rotated at about 10 rpm by suitable means (not shown) to promote uniformity of heating.

Since, only the bottom of crucible 2 is heated at the start some material from the resultant molten zone 7 at the bottom of the charge 1 evaporates and condenses between the female threads of the crucible 2 and the male threads of the sealing plug 4 forming a seal 8 between the crucible 2 and the threaded plug 4.

When the RF coil 6 with its resultant heating zone is opposite the threads the seal is evaporated from the threads and thus broken.

The crucible is then allowed to cool and the sealing plug 4 is unscrewed and the resultant polycrystalline ingot of 3.2 cm length is removed for inspection.

It is noted that the polycrystalline ingot has a concave top.

Ordinarily an ingot made of the material that does not wet the crucible would be convex, i.e. higher in the center.

The reason why the top of the resultant ingot is concave (lower in the center) is that as a result of the seal being formed pressure develops inside the ampul.

The resultant ingot is now removed for inspection. The ingot is found to consist of large grain polycrystalline material of apparently full density with no porosity.

About 0.6 grams of the material is lost through volatization in this step.

This ingot is now put back into the same crucible with the same plug for the recrystallization step. For this recrystallization step the crucible 2 is lowered through the RF coil 6 in the same manner as before but at a rate of 1.5 mm/h. Further the temperature of the heated zone is maintained at a temperature of about 1420° C. Thus in the ingot a molten zone is not produced but a narrow hot zone is produced in the ingot.

This hot zone is sufficiently hot to cause evaporation of a small amount of material from the ingot at the tip remote from the closure. This material condenses between the threads of the crucible 2 and the plug 4 causing a seal to be formed between these parts. As the crucible with the polycrystalline ingot is lowered through the heating zone recrystallization takes place thus causing a monocrystalline ingot to grow in the direction of the seal.

The lowering of the ingot through the heating zone is continued until the heating zone is in the vicinity of the seal wherein the seal is evaporated. The power is then shut off, the crucible 2 is allowed to cool off and the plug 4 is removed from the crucible 2.

The ingot upon removal from the crucible is seen to be largely single crystalline. The resultant ingot is now ready for cutting up into wafers for further use.

It will be apparent that various modifications may be made to the present invention without departing from its scope as defined by the following claims.

What is claimed:

1. A method of forming a large polycrystalline body of a volatile 2,6 or a 3,5 compound which method comprises:
    (a) substantially filling a graphite crucible, at least the internal surface of which is coated with pyrolytic graphite, with a charge of at least one piece of said volatile compound;
    (b) closing said filled crucible with a removable graphite closure at least the surface of which opposing the charge is coated with pyrolytic graphite;
    (c) applying a narrow heating zone of a temperature very slightly above the melting point of said volatile compound to the end of said filled crucible remote from said removable closure thereby forming a narrow molten zone of said volatile compound at said end of said crucible and causing a minor portion of said volatile compound to volatilize and condense on the adjacent surfaces of said crucible and said removable closure thereby forming a temporary seal therebetween;
    (d) progressively moving said narrow molten zone through said charge of said volatile compound in the direction of said seal by applying said narrow heating zone to the interface of said molten zone and said charge of volatile compound while progressively freezing the opposite interface of said molten zone thereby causing a polycrystalline body of said volatile compound to grow in the direction of said seal until substantially all of the charge in said crucible is transformed into said polycrystalline body;
    (e) evaporating said seal from the adjacent surfaces of said crucible and said removable closure;
    (f) removing said removable closure from said crucible and removing said polycrystalline body from said crucible.

2. The method of claim 1 wherein the volatile compound is selected from the group consisting of ZnS, ZnSe, $ZnS_{0.1}Se_{0.9}$, ZnTe, CdS, CdSe, $CdS_{0.5}Se_{0.5}$, $Cd_{0.2}Hg_{0.8}Te$, InP, GaAs and $In_{0.7}Ga_{0.3}As_{0.6}P_{0.4}$.

3. The method of claim 2 wherein an inert external atmosphere of 1 to 20 atmospheres is employed.

4. The method of claim 3 wherein said molten zone is moved through said charge at the rate of about 5–50 mm per hour.

5. The method of claim 4 wherein the volatile compound is ZnSe.

6. The method of claim 5 wherein the temperature of the narrow heating zone is above 1520° C.

7. The method of claim 6 wherein the molten zone is moved through the ZnSe charge at the rate of about 22 mm per hour.

8. A method of growing large monocrystal bodies of 2,6 or 3,5 volatile compounds comprising:
    (a) inserting into a graphite crucible, at least the interior surface of which is coated with pyrolytic graphite, a single polycrystalline body of said compound of a size and shape to substantially fill said crucible
    (b) closing said crucible with a removable graphite closure adapted for said crucible, at least the surface of which opposing the polycrystalline body is coated with pyrolytic graphite;
    (c) applying a narrow heating zone of a temperature range of 5°–100° C. below the melting point of said compound to the end of said polycrystalline body remote from said removable closure, thereby forming a narrow hot zone in a temperature range of about 5°–100° C. below the melting point of said compound in said end of said body, the temperature of said hot zone being sufficiently high to cause a small portion of said polycrystalline body to volatilize and condense on the adjacent surfaces of said crucible and said removable closure thereby forming a temporary seal therebetween;
    (d) progressively moving said narrow hot zone through said polycrystalline body in the direction of said seal by progressively applying said narrow heating zone to the interface of said hot zone and the polycrystalline body while progressively reducing the temperature of the opposite interface of said hot zone thereby causing a monocrystalline body of said compound to grow in the direction of said seal until substantially all of the polycrystalline body in said crucible is transformed into a monocrystalline body;
    (e) evaporating said seal from the adjacent surfaces of said crucible and said removable closure;
    (f) removing said removable closure from said crucible and removing said monocrystalline body from said crucible.

9. The method of claim 8 wherein an inert external pressure of about 1 to 20 atmospheres is employed.

10. The method of claim 9 wherein the volatile compound is selected from the group consisting of ZnS, ZnSe, $ZnS_{0.1}Se_{0.9}$, ZnTe, CdS, CdSe, $CdS_{0.5}Se_{0.5}$ $Cd_{0.2}Hg_{0.8}Te$, InP, GaAs and $In_{0.7}Ga_{0.3}As_{0.6}P_{0.4}$.

11. The method of claim 10 wherein the hot zone is moved through said polycry stalline body at the rate of about 0.5–10.0 mm per hour.

12. The method of claim 11 wherein the volatile compound is ZnSe.

13. The method of claim 12 wherein the temperature of said narrow hot zone is about 1420° C.

14. The method of claim 13 wherein the hot zone is moved through the polycrystalline body at a rate of 1.5 mm per hour.

* * * * *